United States Patent
Van Der Werff

(10) Patent No.: US 7,813,129 B2
(45) Date of Patent: Oct. 12, 2010

(54) COOLING OF ELECTRICAL AND/OR ELECTRONIC COMPONENTS, SPECIFICALLY COMPUTER EQUIPMENT

(75) Inventor: Jan Van Der Werff, Vledderveen (NL)

(73) Assignee: J. Van Der Werff Holding B.V., Leeuwarden (NL)

( * ) Notice: Subject to any disclaimer, the term of this patent is extended or adjusted under 35 U.S.C. 154(b) by 1295 days.

(21) Appl. No.: 10/516,097

(22) PCT Filed: Mar. 11, 2003

(86) PCT No.: PCT/NL03/00184

§ 371 (c)(1), (2), (4) Date: Jul. 28, 2005

(87) PCT Pub. No.: WO03/102746

PCT Pub. Date: Dec. 11, 2003

(65) Prior Publication Data

US 2006/0120045 A1 Jun. 8, 2006

(30) Foreign Application Priority Data

Mar. 31, 2002 (NL) .................................... 1020727

(51) Int. Cl.
*H05K 7/20* (2006.01)
(52) U.S. Cl. ...................... 361/695; 361/694; 361/690; 361/697; 361/679.48; 415/206
(58) Field of Classification Search ................ 361/688, 361/690, 697, 679.48, 694, 695; 415/185, 415/186, 206, 228
See application file for complete search history.

(56) References Cited

U.S. PATENT DOCUMENTS 1,884,898 A * 10/1932 Smith, Jr. ..................... 165/86
3,829,250 A 8/1974 Samson (Continued)

FOREIGN PATENT DOCUMENTS

DE 20107242 7/2001

(Continued)

OTHER PUBLICATIONS

International Search Report (PCT/ISA/210).

(Continued)

*Primary Examiner*—Anatoly Vortman
(74) *Attorney, Agent, or Firm*—Harness, Dickey & Pierce, P.L.C.

(57) ABSTRACT

The invention relates to a casing for electrical and/or electronic components, in particular computer equipment, with an improved cooling. The casing comprises a frame and a number of walls in which suction openings and outlet openings for the cooling air are formed, and wherein the suction opening is provided with filter material. The casing is provided with a number of fans placed between the suction openings and the outlet openings, whereby a flow with a radial or centrifugal component is generated.

Figure 3:
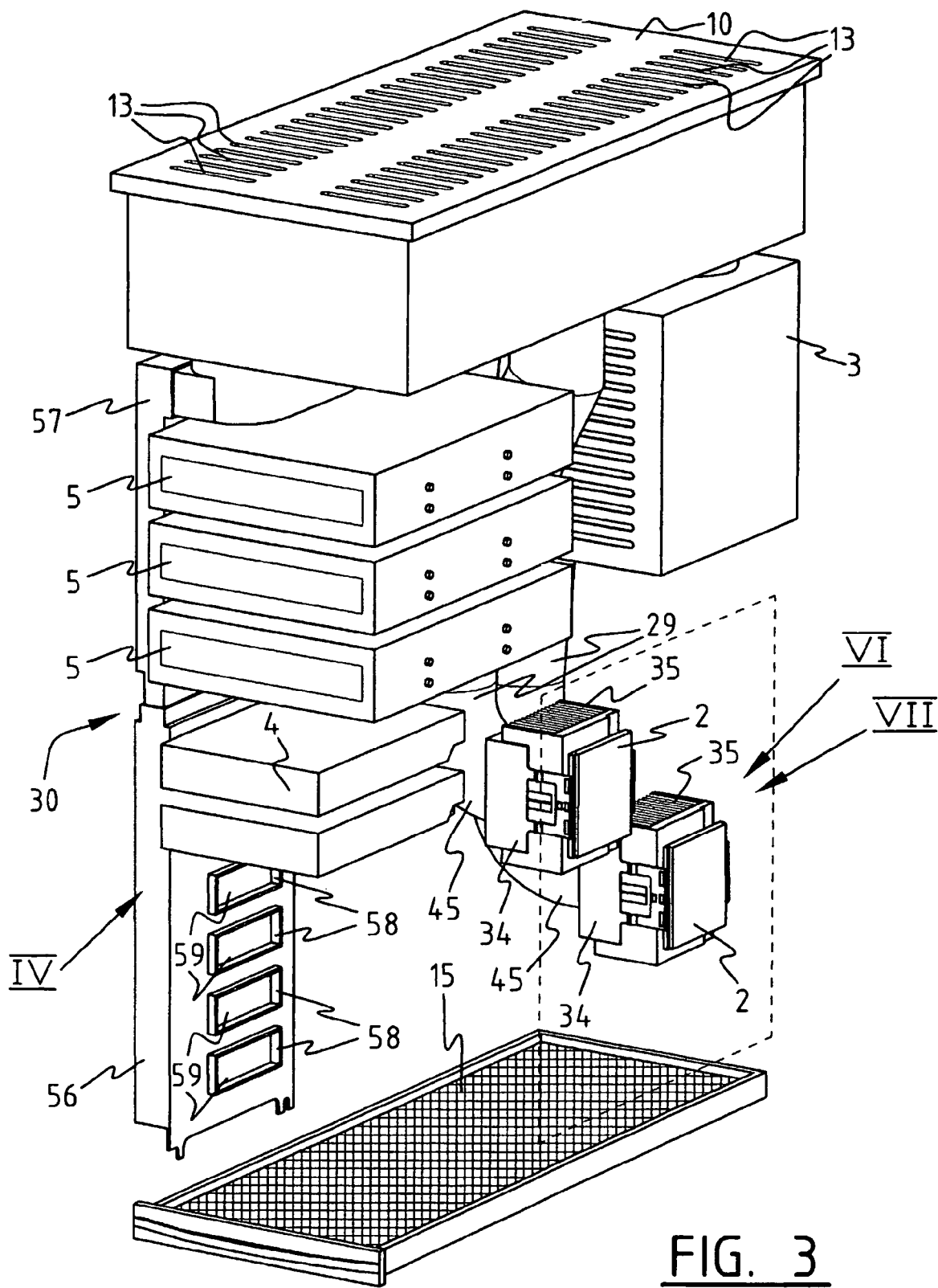

Each fan can be connected to an associated electrical and/or electronic component via a connecting part and/or a hose, while a cooling block can further be connected to each electrical and/or electronic component.

The invention further relates to a fan, a cooling block and a connecting part for use in such a casing.

7 Claims, 11 Drawing Sheets

U.S. PATENT DOCUMENTS

| | | | |
|---|---|---|---|
| 4,838,762 A * | 6/1989 | Savage et al. | 416/187 |
| 4,944,654 A * | 7/1990 | Chou et al. | 415/211.2 |
| 5,107,398 A | 4/1992 | Bailey | |
| 5,409,352 A | 4/1995 | Lin | |
| 5,566,377 A * | 10/1996 | Lee | 361/695 |
| 5,588,803 A * | 12/1996 | Vetter et al. | 416/186 R |
| 5,664,624 A | 9/1997 | Chen et al. | |
| 5,828,550 A | 10/1998 | Horng | |
| 5,838,066 A | 11/1998 | Kitajo | |
| 5,876,278 A | 3/1999 | Cheng | |
| 6,011,299 A | 1/2000 | Brench | |
| 6,067,227 A | 5/2000 | Katsui et al. | |
| 6,168,734 B1 | 1/2001 | Botros | |
| 6,695,038 B2 * | 2/2004 | Lopatinsky et al. | 165/88 |
| 6,884,033 B2 * | 4/2005 | Liao | 415/206 |
| 6,980,434 B2 * | 12/2005 | Ou Yang et al. | 361/695 |
| 7,071,587 B2 * | 7/2006 | Lopatinsky et al. | 310/64 |
| 7,108,482 B2 * | 9/2006 | Chapman | 416/185 |
| 2002/0062947 A1 | 5/2002 | O'Connor | |
| 2002/0079086 A1 * | 6/2002 | Huang et al. | 165/80.3 |
| 2003/0048013 A1 * | 3/2003 | Lopatinsky et al. | 310/52 |
| 2004/0245866 A1 * | 12/2004 | Lopatinsky et al. | 310/64 |
| 2005/0069410 A1 * | 3/2005 | Liao | 415/158 |
| 2005/0088817 A1 * | 4/2005 | Ou Yang et al. | 361/695 |
| 2005/0274497 A1 * | 12/2005 | Huang et al. | 165/121 |
| 2008/0087407 A1 * | 4/2008 | Yang | 165/104.33 |

FOREIGN PATENT DOCUMENTS

| | | |
|---|---|---|
| EP | 0887725 | 12/1998 |
| GB | 2293487 | 3/1996 |
| WO | WO 00/74458 | 12/2000 |

OTHER PUBLICATIONS

International Search Report mailed Feb. 16, 2004.

* cited by examiner

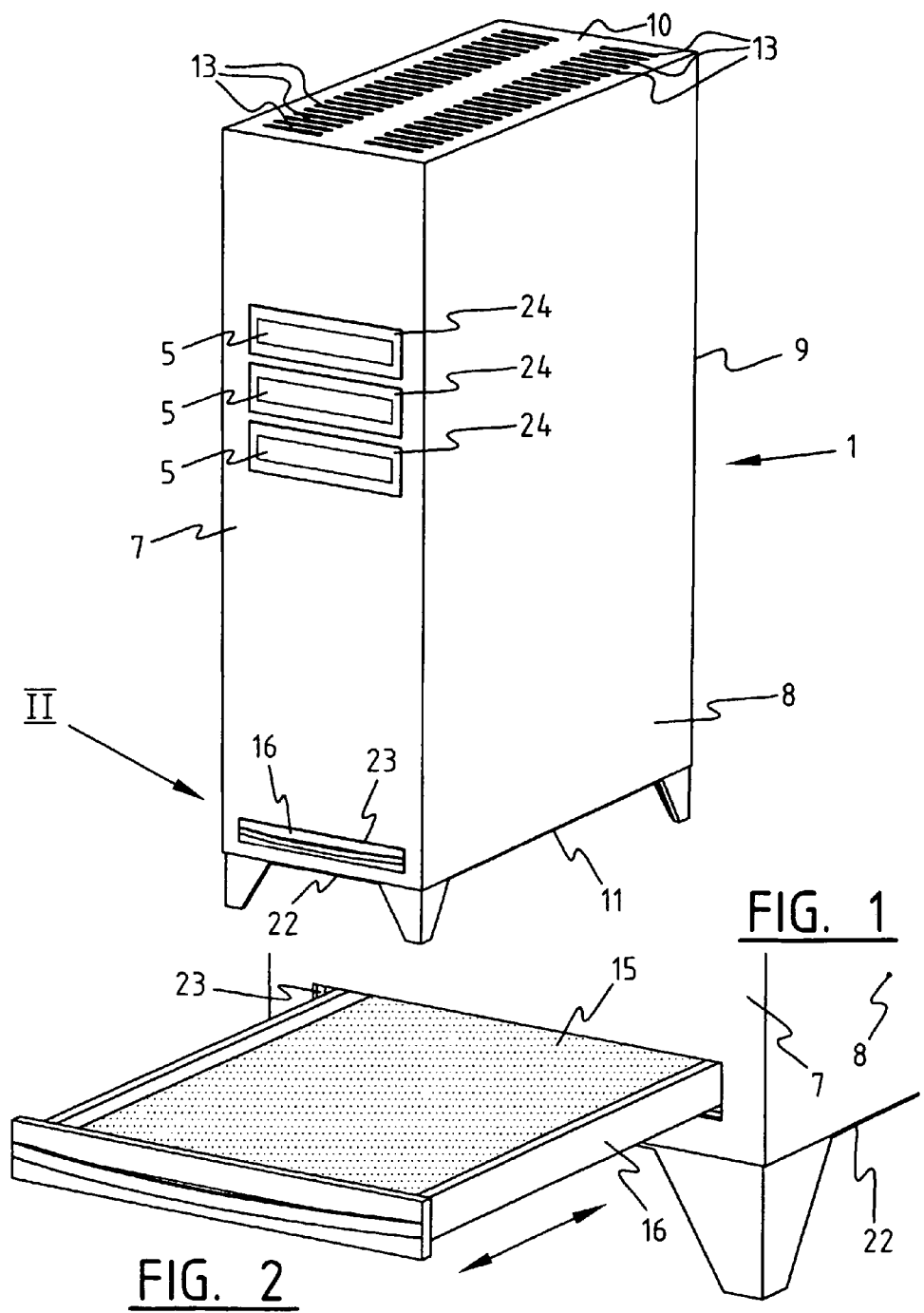

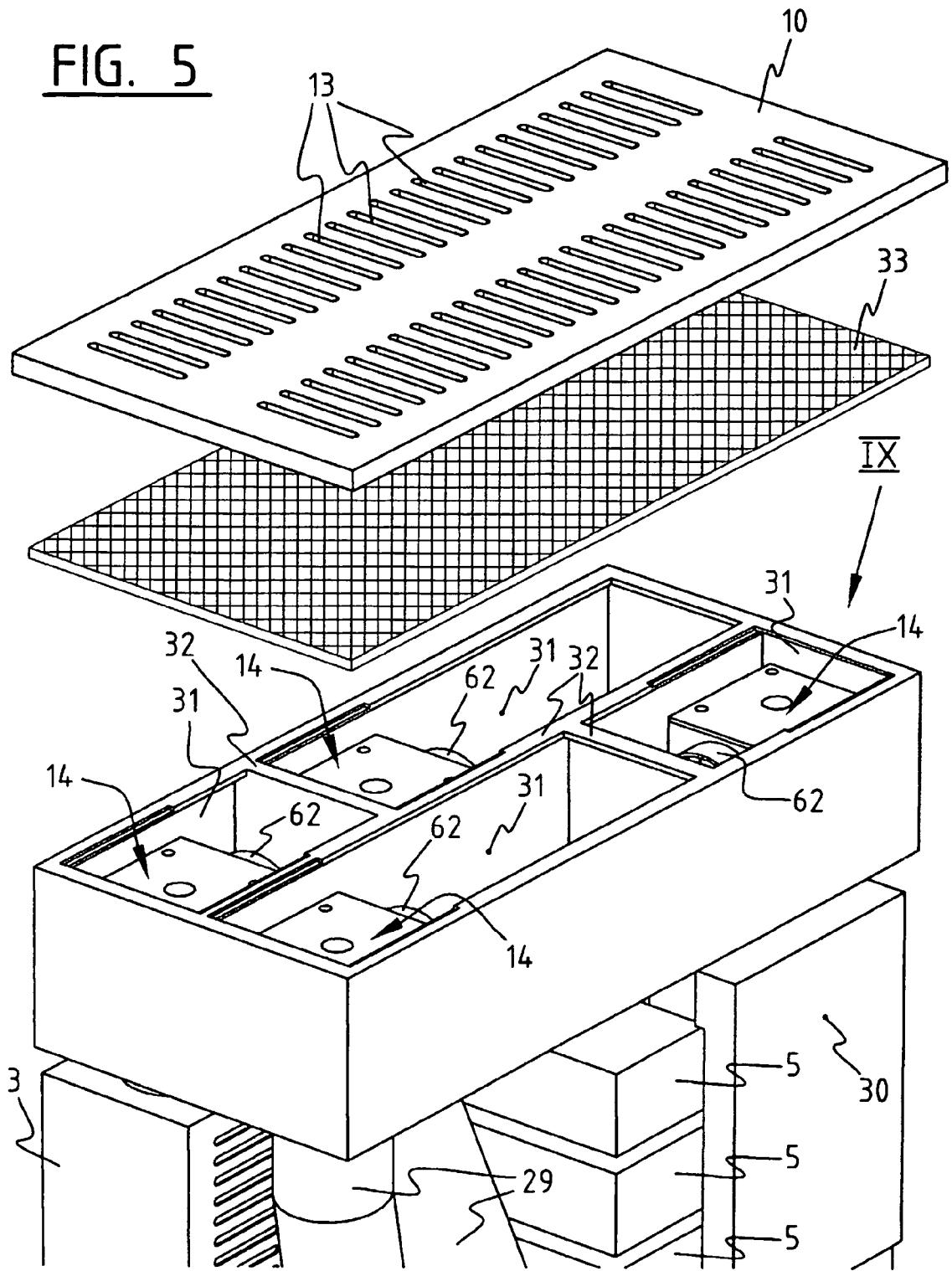

COOLING OF ELECTRICAL AND/OR ELECTRONIC COMPONENTS, SPECIFICALLY COMPUTER EQUIPMENT

The invention relates to a improvements in or relating to cooling of electrical and/or electronic components, and computer equipment in particular. The invention relates specifically to an improved casing for electrical and/or electronic components, in particular computer equipment, and parts to be optionally applied therein for the purpose of improving the cooling, such as a fan, a cooling block and a connecting part.

Owing to the increasing miniaturization of electrical and electronic components and the increasing power thereof, an ever-increasing amount of heat is produced by such components in an increasingly smaller space. Cooling of the components is therefore becoming more and more of a problem. This is further intensified by the fact that the surface area available for heat transfer is also becoming increasingly smaller.

In order to obviate this problem larger and stronger fans are increasingly being used, whereby more cooling air can be carried along the components. Cooling blocks of larger dimensions are also being opted for. The gain in space which would be possible due to the reduction in the size of the components is hereby largely lost again. In addition, fans with greater power also demand more current and the larger air displacement results in problems in respect of noise and dust.

The invention now has for its object to propose improvements in the field of cooling electrical and/or electronic components, whereby the above described problems do not occur, or do so to a lesser extent. According to a first aspect, the invention provides for this purpose a casing for electrical and/or electronic components, in particular computer equipment, which is provided with a frame and a number of walls enclosing the frame substantially on all sides, in which at least one suction opening and at least one outlet opening for the cooling air is formed, wherein at least the suction opening is provided with filter material. Making use of filter material can prevent dust being entrained with the cooling air.

The filter material is preferably arranged releasably in the casing so that it can be removed easily to be cleaned or replaced.

A casing which is simple to assemble and seal is obtained when at least some of the walls are formed integrally and folded round the frame.

As is usual, the casing according to the present invention has openings which provide access to the component(s) received therein. In order to avoid as far as possible dust penetrating into the casing and to allow the suction of cooling air to proceed optimally, the casing advantageously has means for substantially airtight sealing of at least some of the access openings.

In order to generate a flow of cooling air through the casing, this latter is advantageously provided with at least one fan placed between the suction opening(s) and the outlet opening(s). A very efficient cooling, which moreover only requires little power, is achieved when the at least one fan is embodied such that the flow of the cooling air generated thereby has a radial or centrifugal component.

When the at least one fan is arranged in the vicinity of the at least one outlet opening, the cooling air is drawn instead of blown through the casing, thereby ensuring a more uniform flow along the components. The heated air is furthermore thus blown directly out of the casing, so that there is no danger of it being circulated.

So as to make optimal use of the natural tendency of warm air to rise, the suction opening(s) are preferably arranged close to the bottom of the casing and the fan(s) and the outlet opening(s) close to the top of the casing.

An optimal cooling of the different components is achieved in the casing, which can comprise at least one processor, at least one power supply and at least one storage unit, when a separate fan is provided for each of these. For a good guiding of the cooling air it is recommended herein that each fan is connected to the associated electrical and/or electronic component via a connecting part and/or a hose. Rapid installation is ensured when the or each connecting part comprises a rapid-action coupling. In the case a number of storage units is accommodated in the casing, these are preferably connected to a common duct leading to the associated fan, thereby optimizing the circulation of cooling air along these units.

For a better cooling at least one cooling block connected to the electrical and/or electronic component is further arranged in the casing according to the invention. An efficient heat transfer is obtained when the or each cooling block comprises a base for connecting to the component for cooling and a number of substantially parallel cooling fins protruding therefrom.

The invention also relates to a fan for drawing in cooling air for electrical and/or electronic components which is particularly suitable for application in a casing as described above. Such a fan comprises in conventional manner a housing with at least one suction opening, at least one outlet opening and at least one wheel arranged between the suction opening and the outlet opening for rotation on an axis and bearing a number of blades. Fans for cooling computer equipment have been embodied heretofore solely as radial fans, wherein the suction opening, the outlet opening and the blade wheel are arranged coaxially in a tubular housing. Such an axial fan has a relatively low efficiency, whereby a relatively large fan has to be used to achieve a high cooling capacity, which moreover has to develop a considerable rotation speed. The noise production of axial fans is hereby relatively high.

The invention now has for its object to improve such a fan such that with a relatively small fan requiring little power a large amount of cooling air can nevertheless be displaced per unit of time. According to the invention this is achieved with a fan of the described type in that the blades in the wheel are placed and embodied such that the flow of the cooling air generated thereby has a radial or centrifugal component. By making use of a centrifugal fan or a so-called mixed flow fan a large flow of cooling air can thus be generated, while the energy consumption of the fan and the noise production thereof remain limited.

A structurally simple embodiment of this fan is characterized in that the blades extend at least partly parallel to the rotation axis of the wheel. The blades are preferably formed herein by elongate, profiled slats arranged distributed on a rotatable ring and extending substantially parallel to the rotation axis of the ring. In this case the suction opening can advantageously debouch within a periphery defined by the slats.

In order to limit the outflow speed of the cooling air, and thereby the noise production, the housing preferably has an inner wall moving in a spiral shape away from the wheel in the rotation direction of the blade wheel, whereby the cross-section of the outflow duct gradually increases. The outflow opening can herein advantageously be oriented substantially transversely of the rotation axis of the blade wheel.

The invention further relates to a cooling block for electrical and/or electronic components which is likewise particularly suitable for use in a casing as discussed above. Conventional cooling blocks comprise a base for connecting to the component for cooling and a number of substantially parallel cooling fins protruding therefrom. The invention now has for its object to provide a cooling block with an improved heat transfer. An improved cooling is achieved according to the invention in that the cooling block is provided with at least one wall running substantially transversely of the cooling fins for deflecting of the flow thereby. This deflecting of the flow ensures that the cooling air must cover a longer path through the cooling block, whereby more time is available for heat transfer between the cooling ribs and the air brushing therealong.

A structurally simple embodiment is obtained when the deflecting wall is received in a cut-away portion running through adjacent cooling fins. So as to limit the number of different parts, the deflecting wall advantageously forms part of a connecting part arranged on the cooling block. Different functions can thus be integrated into one component.

Finally, the invention further relates to a connecting part for fixing a mouthpiece of a fan or fan hose to an electrical or electronic component, which is once again particularly suitable for use in a casing for computer equipment of the above described type. Such a connecting part comprises in conventional manner a frame with fixing means for the mouthpiece and means for connecting the frame to the electrical or electronic component, and is characterized according to the invention in that the connecting means comprise a rapid-action coupling. Assembly operations are hereby simplified.

This rapid-action coupling preferably comprises at least two hook parts engaging round the electrical or electronic component and tensioning means connected thereto. A coupling can be effected in rapid and reliable manner by arranging the hook parts behind a protruding portion of the component(s) for cooling and subsequently tensioning the tensioning parts. By making use of two or more hook parts and tensioning parts a cooling block enclosed between the connecting part and the component for cooling is pressed uniformly onto the component. A tensioning part which is easy to operate comprises a spring-loaded lever.

For an airtight connection the frame is preferably dimensioned such that it can be placed in close-fitting manner round at least a part of a cooling block connected to the component. When the connecting part is intended for fixing to a cooling block with a cut-away portion for arranging a deflecting wall, the frame can herein comprise at least one wall part to be received in the cut-away portion running through the cooling fins.

Figure 4:
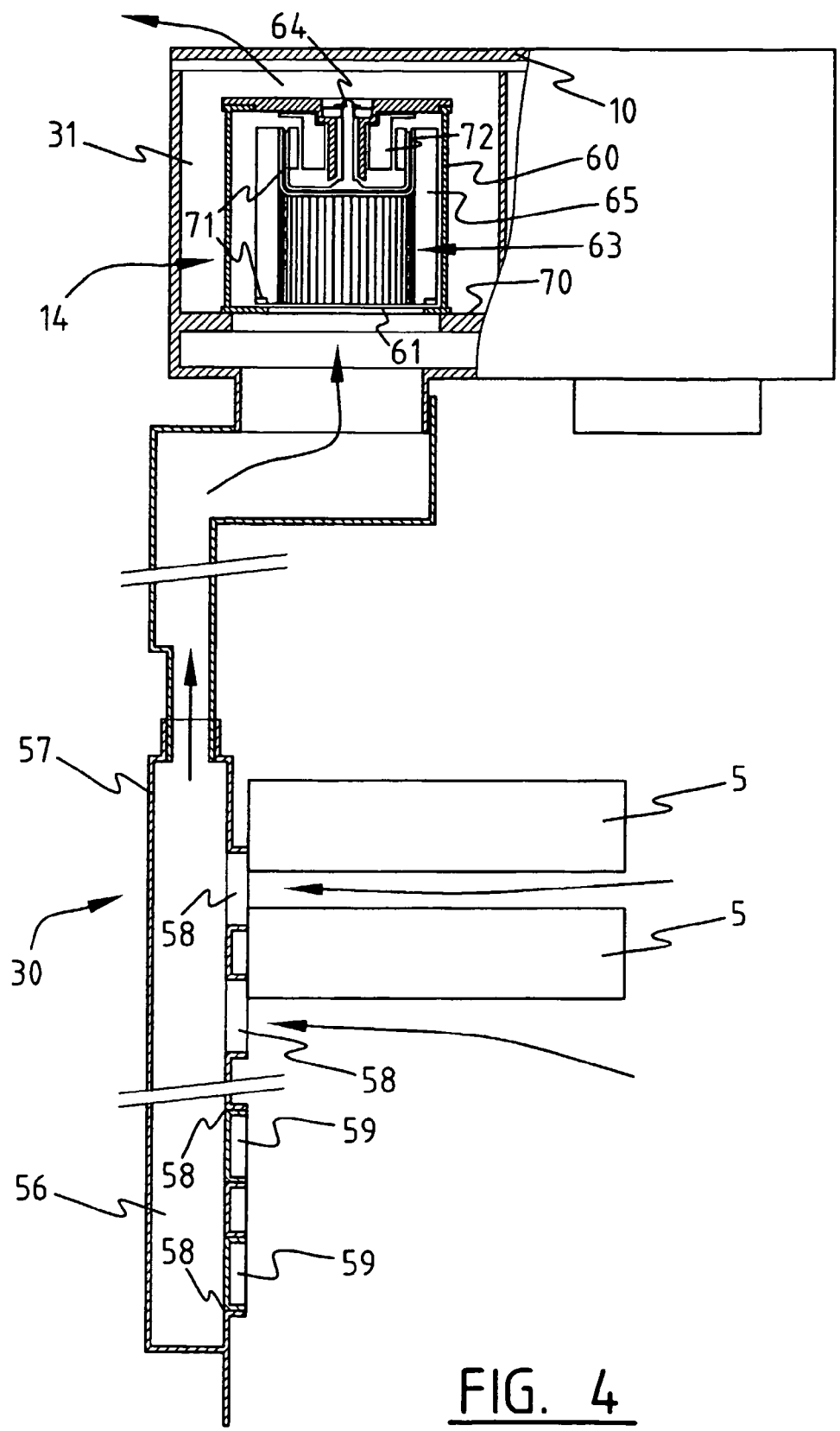
Figure 6A:
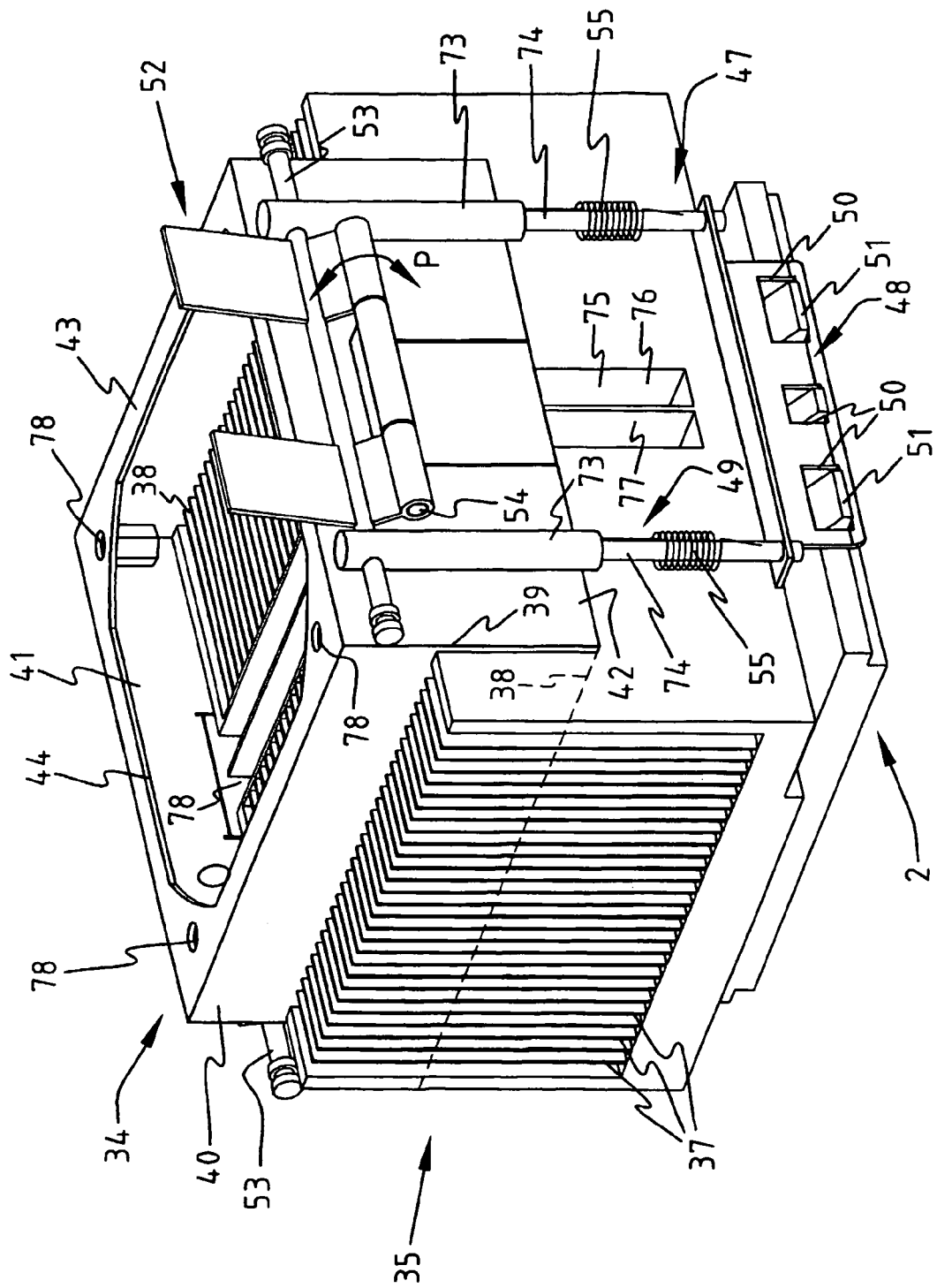
Figure 6B:
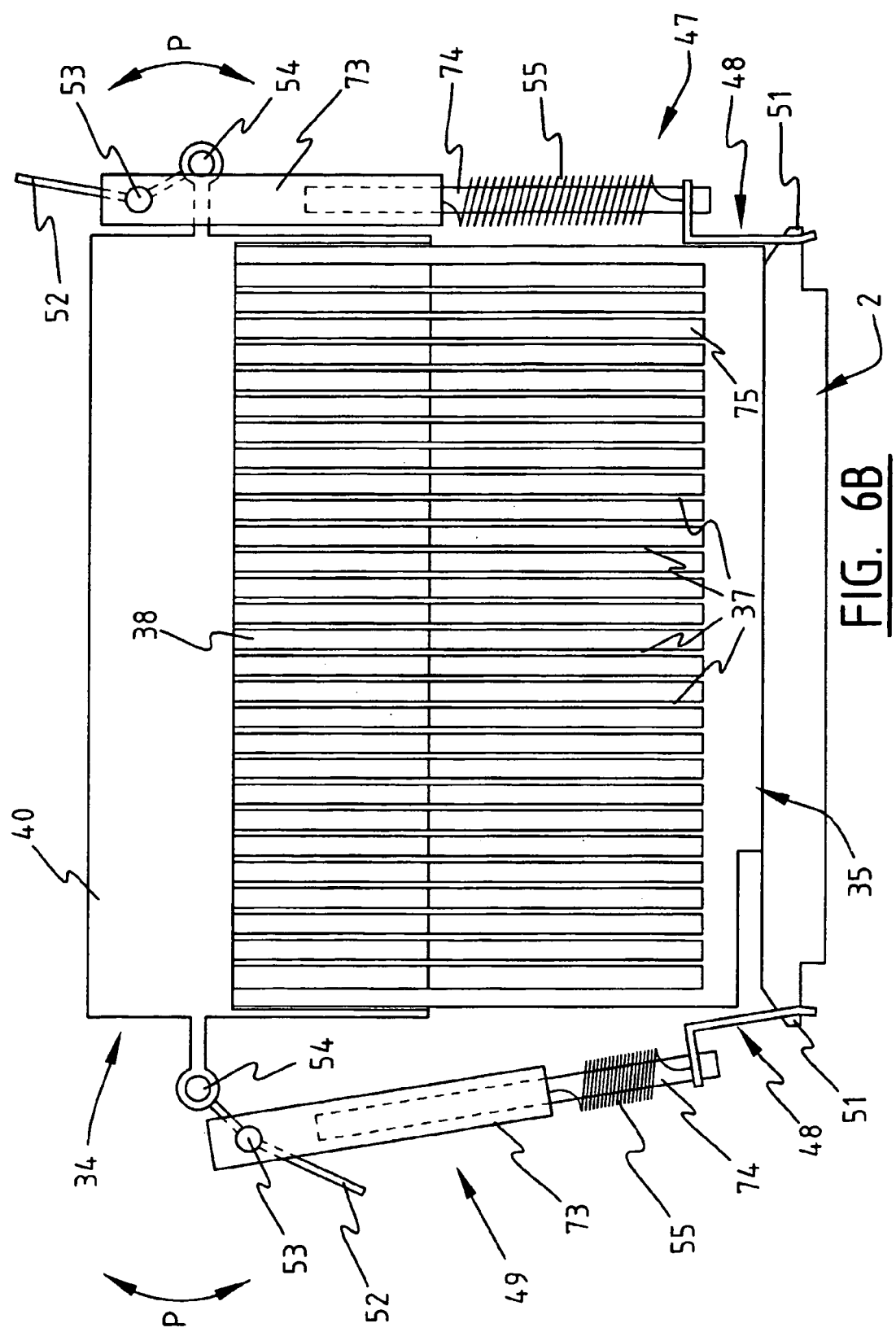
Figure 7:
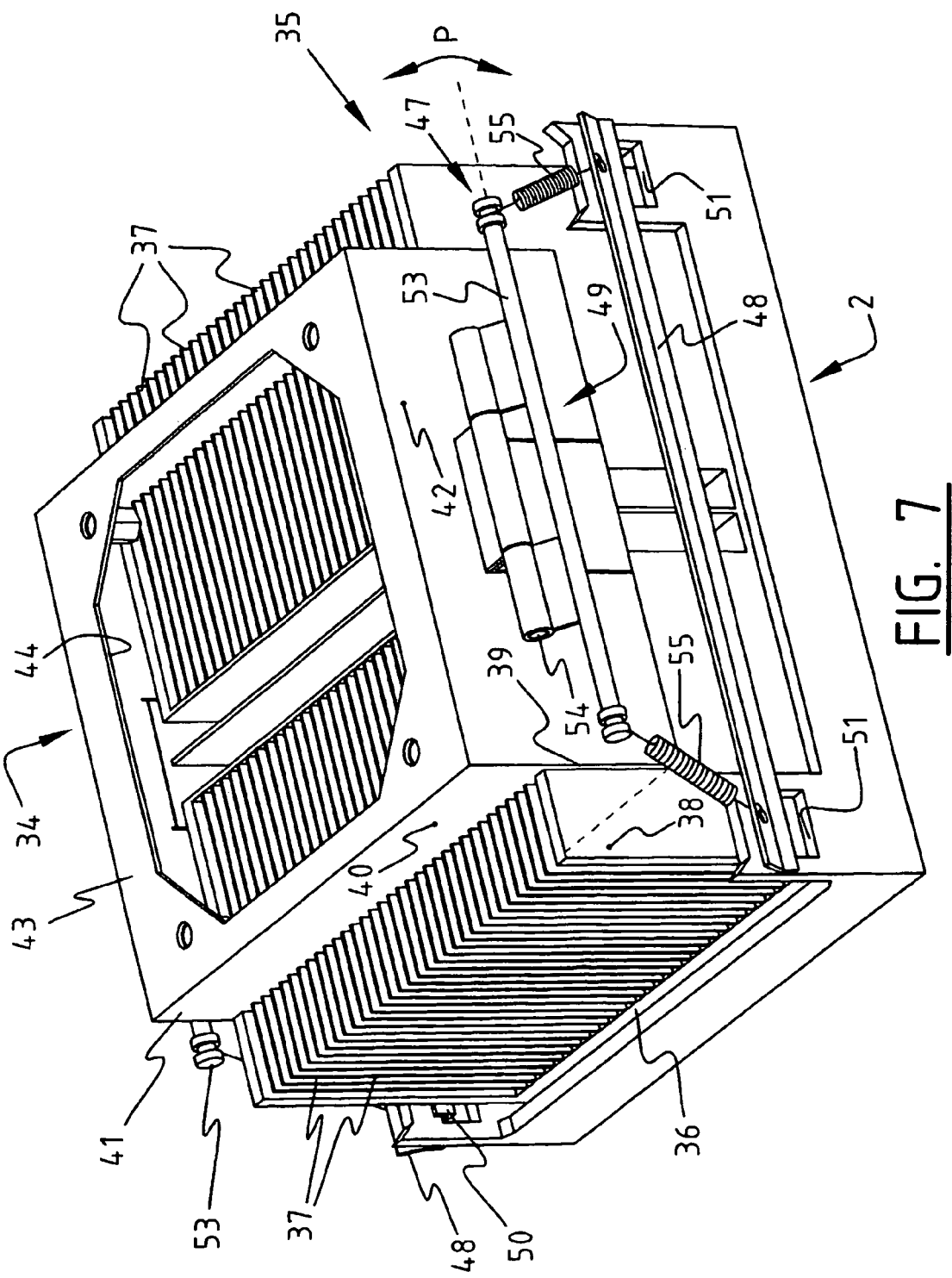
Figure 8:
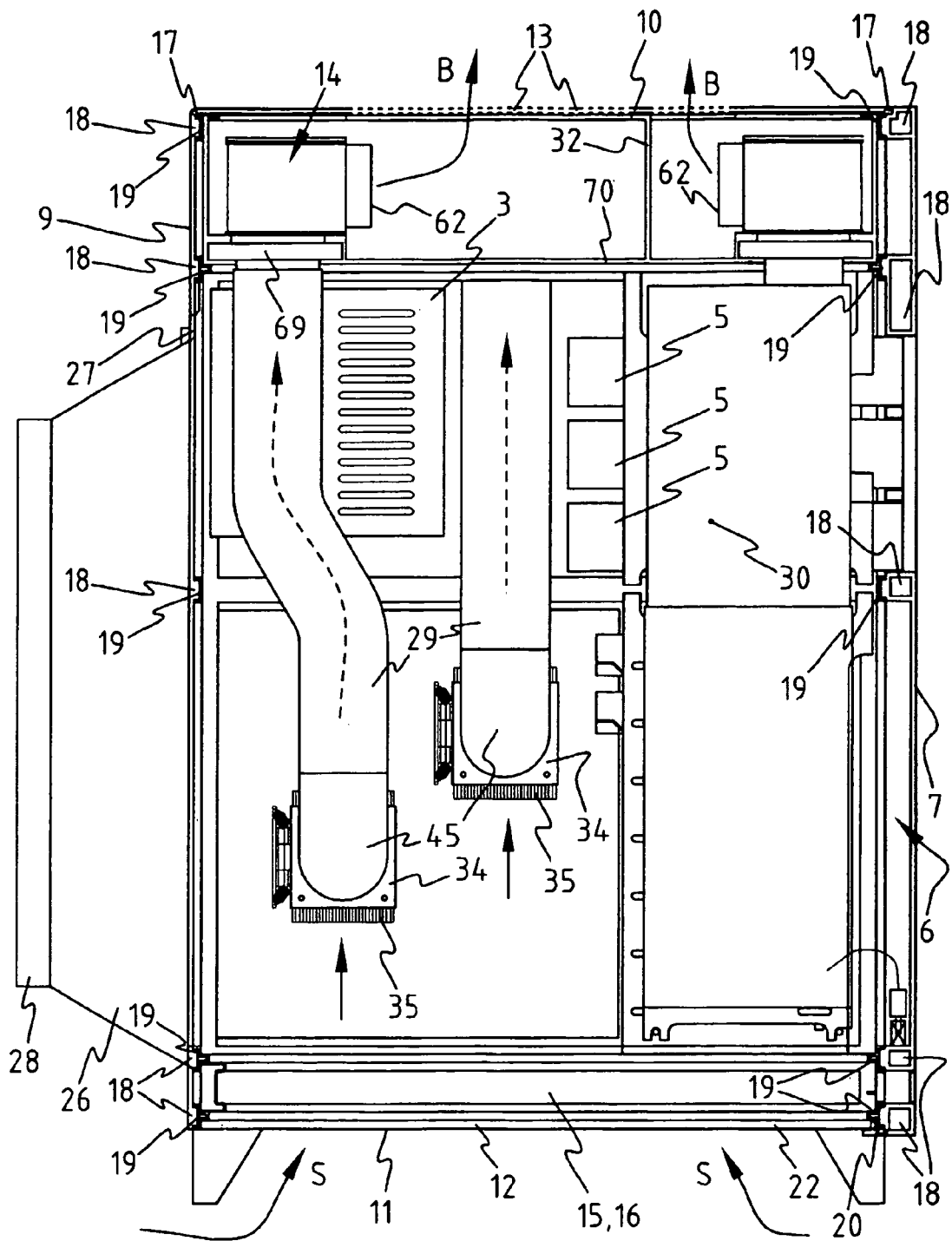
Figure 9:
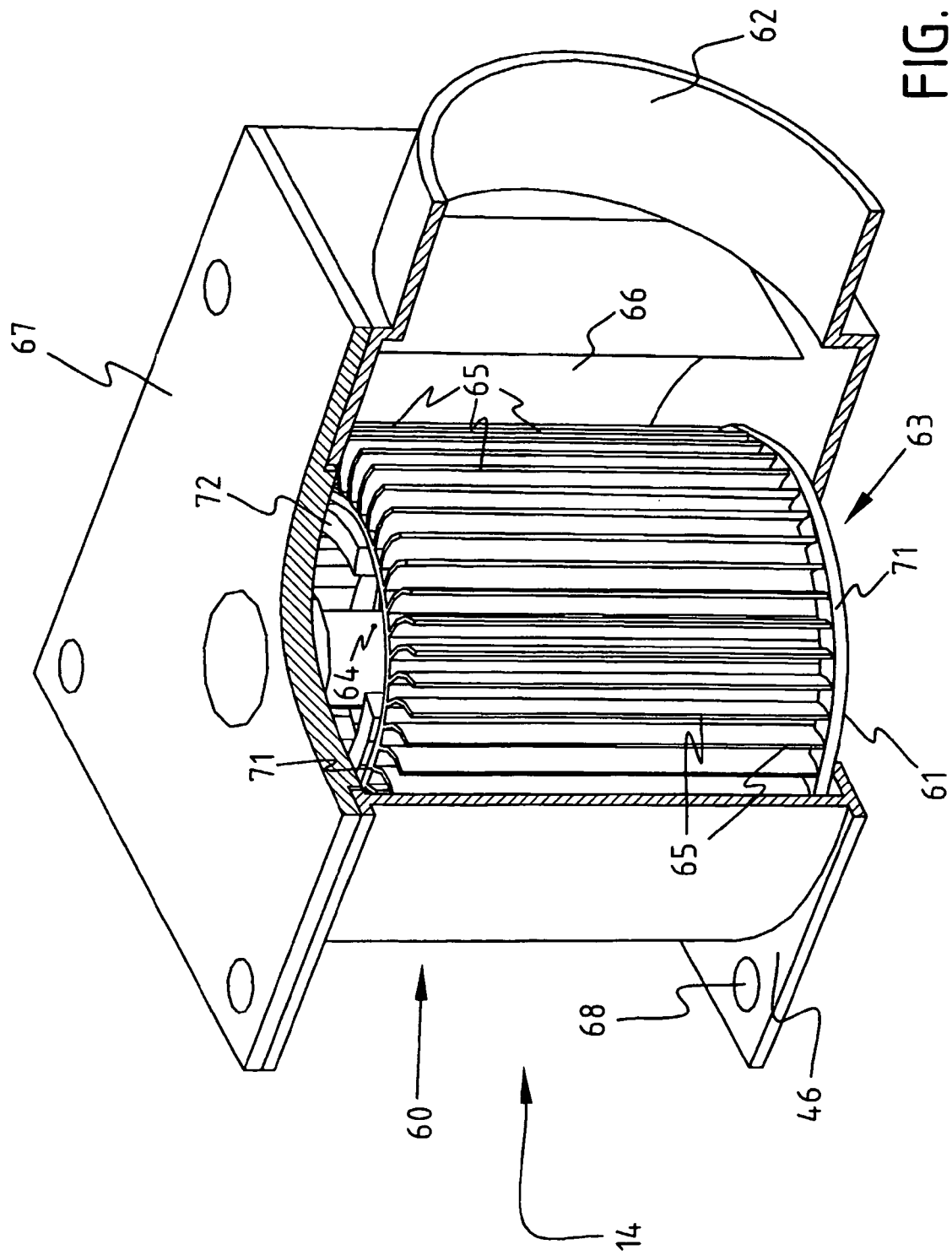
Figure 10:
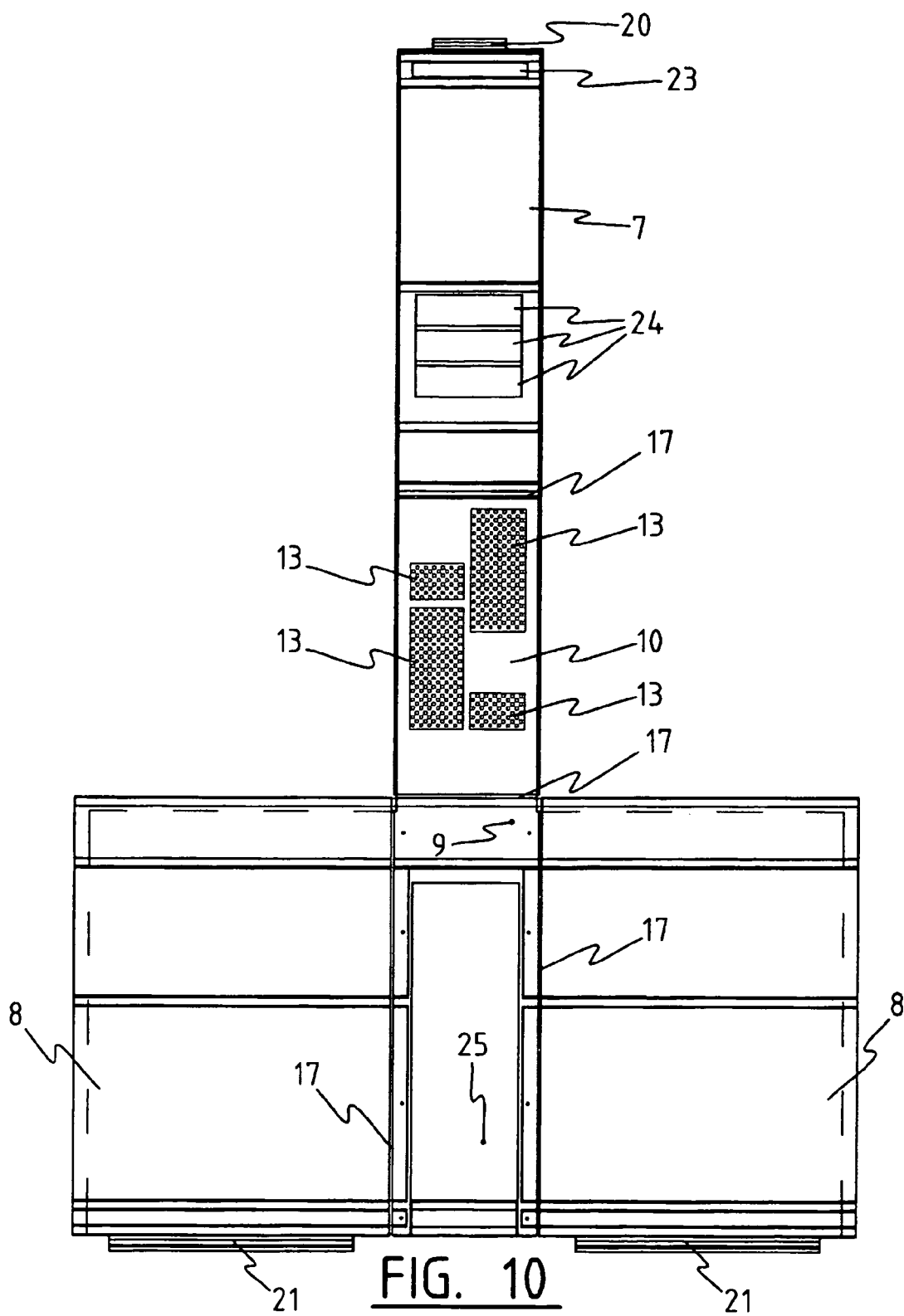
Figure 11:
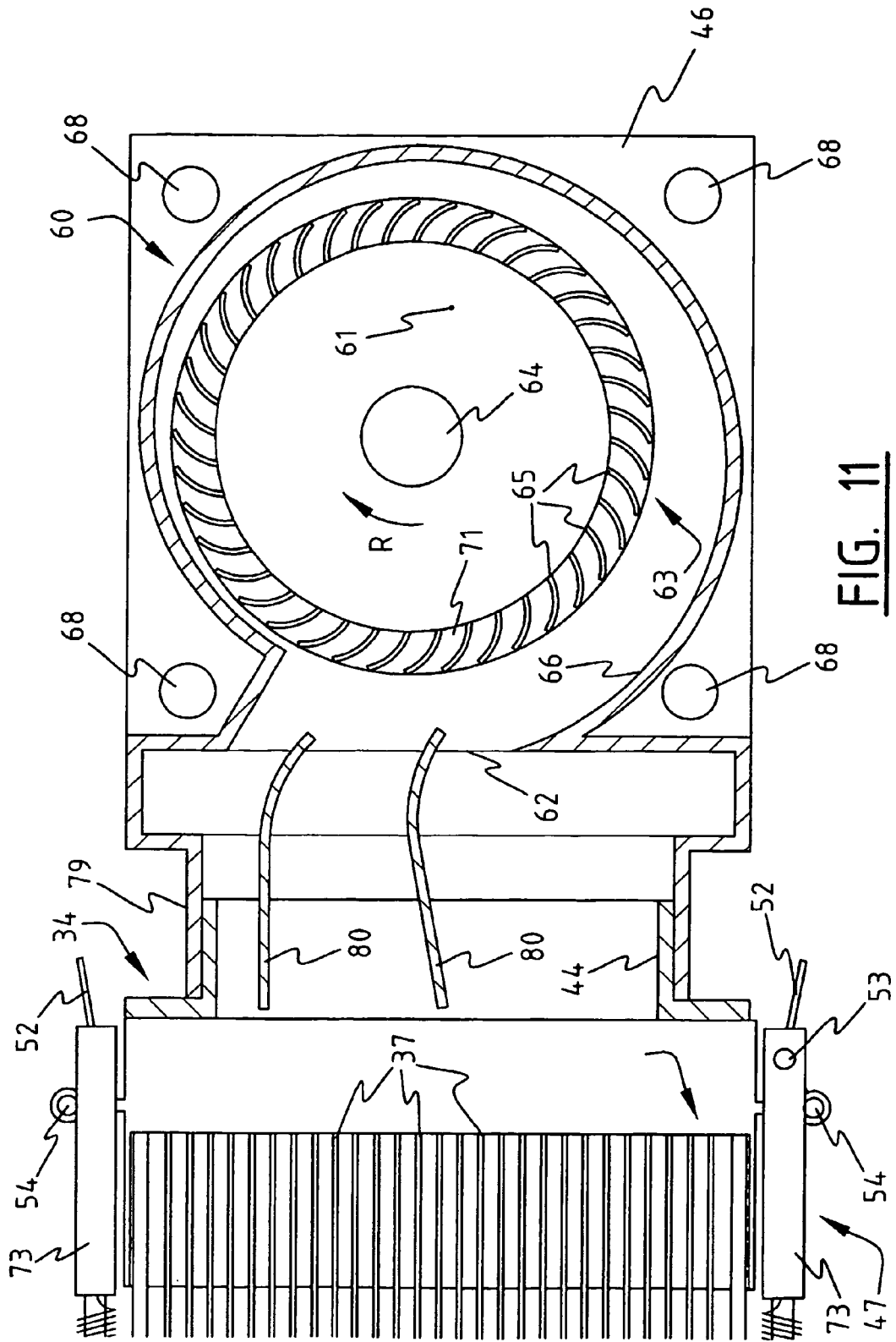

The invention will now be elucidated on the basis of a number of embodiments, wherein reference is made to the annexed drawing, in which:

FIG. 1 shows a perspective view of a casing for electrical and/or electronic components, in particular computer equipment, according to the invention, FIG. 2 is a detail view along arrow II in FIG. 1 in which a releasable filter is shown in the pulled-out position, FIG. 3 shows a schematic perspective view of a number of components of the casing of FIG. 1, FIG. 4 is a partly cross-sectional front view along arrow IV in FIG. 3, in which a number of storage units and an associated cooling fan are shown, FIG. 5 is a perspective view with exploded parts of the top part of the casing of FIG. 1, FIG. 6A is a perspective detail view along arrow VI in FIG. 3 of a first embodiment of cooling block and connecting part for use with a determined processor, FIG. 6B is a front view of the cooling block and connecting part of FIG. 6A, FIG. 7 is a view corresponding with FIG. 6B of an alternative embodiment of cooling block and connecting part for use with another processor, FIG. 8 shows a cut-away rear view of the casing as according to arrow VIII in FIG. 3, FIG. 9 shows a cut-away perspective view of the cooling fan, FIG. 10 shows a plan view of the walls of the casing in folded-out position, and FIG. 11 shows a longitudinal section through an alternative embodiment of the cooling fan which is adapted to blow cooling air through the casing.

A casing 1 for electrical and/or electronic components, such as motherboards with processors 2 (FIG. 3), graphic cards, a power supply 3 and storage units, for instance a number of hard disk stations 4 and CD-ROM and/or DVD players and/or writers 5, comprises a frame 6, a front wall 7, two side walls 8, a rear wall 9, an upper wall 10 and a base 11 (FIG. 1).

Walls 7-10 enclose the frame 6 practically on all sides and form a substantially airtight casing. In the shown embodiment the frame 6 is manufactured from metal, while the front wall 7, upper wall 10, rear wall 9 and side walls 8 are formed integrally (FIG. 10) from plastic which is optionally covered on the inside with a layer of sound-damping material, for instance felt. These walls 7-10 are mutually connected by fold lines 17 and have on the inside protruding strips 18 which in the assembled situation of casing 1 engage in profiles 19 of frame 6 (FIG. 8). In addition, the front wall 7 and side walls 8 are provided along their lower edge with clamping strips 20, 21 which are snapped round a lower edge 22 of frame 6 to fix the walls 7-10 to frame 6.

The base 11 is left open and thus forms a suction opening 12, while a number of outlet openings 13 is formed in upper wall 10 of casing 1. Through these openings 12, 13 cooling air is drawn into casing 1 (arrows S) and blown out of it again (arrows B). Use is made for this purpose of fans 14, in the shown embodiment four in number, which are placed between suction openings 12 and outlet openings 13. In the shown embodiment the fans 14 are arranged close to outlet openings 13. Fans 14 hereby draw the cooling air through casing 1 instead of blowing it therethrough. Outlet openings 13 are here arranged in upper wall 10. Owing to this arrangement an airflow is generated from bottom to top through casing 1 which enhances the natural tendency of warm air to rise.

Casing 1 according to the invention is intended to produce a considerably higher cooling capacity than conventional computer housings, inter alia by increasing the amount of cooling air which flows through casing 1. In order to prevent large quantities of dust herein being accumulated in the casing, whereby the operation of the vulnerable electronic components would be affected, the base 11 which defines the suction opening 12 is covered with filter material 15. This filter material 15 is in the form of a mat accommodated releasably in a drawer 16, which is in turn received slidably in an opening 23 close to the bottom edge of front wall 7 so that filter material 15 can be readily replaced or cleaned.

Further formed in front wall 7 are openings 24 through which access is obtained to DVD players 5. When these openings 24 are not is use, for instance because fewer than the maximum number of components are accommodated in casing 1, they are closed in airtight manner with snap-on covers (not shown). Sealing material, for instance felt, is moreover arranged around openings 24 in order to prevent as far as possible air being drawn in through openings 24. Similar sealing material can also be arranged along the opening 23 for the filter drawer 16.

In rear wall 9 is formed a relatively large opening 25 through which the necessary cabling can be connected in simple manner to motherboards 2, graphic card(s) and power supply 3. These are specifically power supply cables and connecting cables to peripheral equipment such as a monitor, a keyboard, a printer and the like. In order to prevent as far as possible air being drawn in through this opening 25, it is sealed by means of a sleeve 26 tapering toward the outside which is fastened using velcro to the peripheral edge 27 of opening 25, and which has a relatively narrow opening 28, which is likewise closed using velcro in close-fitting manner around the cables fed therethrough.

The above described combination of measures ensures that cooling air can only enter and leave the casing 1 again through the suction and outlet openings 12, 13 formed specially for this purpose. A guided flow of the cooling air through casing 1 is hereby achieved.

The guiding of the cooling airflows through casing 1 is optimized further in the shown embodiment in that the different components 2-5 for cooling are connected to their associated fan(s) 14 via cooling hoses 29 and/or ducts 30. This prevents warm air coming from components 2-5 being able to circulate freely through casing 1. In addition, fans 14 are each accommodated in their own closed compartment 31 on the top side of casing 1. The separating walls 32 between compartments 31 can here also be covered with a layer of absorbent material, for instance felt, in order to limit the noise production as far as possible. In the shown embodiment another layer of sound-damping material 33 is further arranged above compartments 31 in order to limit as far as possible the egress of sound from casing 1 into the surrounding space. Instead of a sound-damping mat, use could also be made of for instance a labyrinth through which the cooling air would have to leave the casing 1.

For the best possible airtight connection between components 2 and the cooling hoses 29 for coupling thereto, use is made of a connecting part 34. In the shown embodiment this connecting part 34 is dimensioned such that it connects close-fittingly onto a cooling block 35 connected to component 2 (FIGS. 6, 7) in order to transfer the heat generated thereby as efficiently as possible to the flow-by cooling air.

In the shown embodiment the cooling block 35 comprises a base 36 which is connected to the component for cooling, here therefore to the motherboard with processor 2, and a number of parallel cooling fins 37 protruding from base 36. The base and the cooling fins are here formed integrally from a material with a high heat conductivity, for instance copper or an alloy thereof. In order to intensify the contact between the flow-by cooling air and cooling fins 37, two deflecting walls 38 are formed transversely of cooling fins 37, which walls extend from the free edges of cooling fins 37 over a part of the height of cooling fins 37 in the direction of base 36. The cooling air is hereby forced to follow a winding path (arrows C) between cooling fins 37, whereby the flow speed is decreased and contact time increased. Deflecting walls 38 are received in cut-away portions 39 formed in cooling fins 37.

In addition to the half-height deflecting walls 38, cooling block 35 is also provided with two deflecting walls 75 extending from the base 36 over the whole height of cooling fins 37. These walls 75 serve to prevent the cooling air flows which develop from both sides of cooling block 35 from meeting each other in the middle of the block. This would result in large swirls and associated pressure losses. Walls 75 deflect these cooling air flows in controlled manner so that they flow away almost transversely of base 36 and, after leaving cooling block 35, provide a uniform flow pattern. Between walls 75 is defined a space 76 through which cooling air can also be drawn in. If necessary, secondary cooling fins 77 running transversely of cooling fins 37 can further be placed in this space 76. A single central deflecting wall 75 could also be used instead of two walls 75 with an intermediate space 76.

In the shown embodiment the deflecting walls 38 are formed by two parallel side wall parts 40 of the frame 41 of connecting part 34. This frame 41 further comprises two transverse walls 42, the distance between which is the same as the width of cooling block 35, and an upper plate 43. Formed in upper plate 43 is an opening 44 for drawing off cooling air to the cooling hose 29 or directly to fan 14. Upper plate 43 also has means 78 for fixing thereto either a mouthpiece 45 of cooling hose 29 (FIG. 8) or a base plate 46 of fan 14 (FIG. 9). These fixing means 78 here take the form of four holes for receiving screws or bolts.

In addition, connecting part 34 is provided with means 47 for connecting frame 41 to the component 2-5 for cooling or the cooling block 35 optionally mounted thereon. So as to be able to effect this connection in rapid and simple manner the connecting means 47 here take the form of a rapid-action coupling.

In the shown embodiment this rapid-action coupling is formed by two hook parts 48 and tensioning parts 49 connected to each of the hook parts 48. Each hook part 48 consists of a plate or strip with a number of openings 50 formed therein which can be pushed round protruding parts 51 of the component for cooling. Each of the hook parts 48 is connected to frame 41 via tensioning part 49. This tensioning part 49 comprises a lever 52 which is pivotable on a shaft 54 mounted on frame 41. Lever 52 has a transverse carrier 53 to which are fixed outer tubes 73 of two telescopic legs. The corresponding inner tubes 74 are fixed to the corresponding hook part 48. The telescopic legs are urged to their shown extended position by compression springs 55. Each lever 52 is pivotable as according to arrow P between the position shown on the right in FIG. 6B, in which springs 55 are not under pressure, and a position rotated through about 180 E on the left in FIG. 6B, in which lever 53 rests against frame 41 and springs 55 are tensioned and pull the connecting part 34 taut against cooling block 35.

In an alternative embodiment of connecting part 34, which can be applied for another type of motherboard with a different processor 2, hook parts 48 each have two protrusions 50 and the motherboard is provided with openings 51. In this embodiment the transverse carrier 53 of each lever 52 is further connected to hook part 48 by means of two draw springs 55.

For guiding of the air coming from storage units 4, 5, use is not made in the shown embodiment of a cooling hose 29 and connecting part 34 but of a duct 30 which extends as a kind of "chimney" along the storage units 4, 5 (FIG. 3). This duct 30 is formed here by a lower part 56 which runs along hard disk stations 4 and an upper part 57 connecting thereto which runs along the CD-ROM or DVD stations 5. Openings 58 are arranged in duct 30 at the location of points where storage units 4, 5 can be connected thereto (FIG. 4). When no storage unit 4, 5 for cooling is present at the relevant location, these openings 58 can be closed in airtight manner by covers 59 so that the cooling air is drawn only along the storage units 4, 5 actually installed in casing 1.

As stated, there are four fans 14 accommodated in casing 1 in the shown embodiment, one of which is intended for cooling of storage units 4, 5, one for cooling power supply 3 and one for each of the two motherboards 2. When only one motherboard 2 is arranged in casing 1, a total of three fans 14 can suffice. Power supply 3 is otherwise connected directly, thus without interposing of a cooling hose 29 or duct 30, to the associated fan 14.

Fans 14 are adapted according to the invention to generate a flow with a radial or centrifugal component. In the shown embodiment each fan 14 is provided for this purpose with a housing 60 with a suction opening 61, an outlet opening 62 and a wheel 63 arranged therebetween which is rotatable on a shaft 64 and which bears a number of blades 65 (FIG. 9). Housing 60 is formed by a base plate 46 in which the suction opening 61 is arranged, a spiral-shaped side wall 66 having therein the outlet opening 62, and an upper plate 67. Base plate 46 is provided with means 68 for fixing the fan 14 to a connecting part 34, to an end part 69 of a cooling hose 29 or to a bottom 70 of a compartment 31. Connecting means 68 here take the form of a number of holes for receiving screws, bolts or other fastening elements.

Blades 65 extend parallel to rotation shaft 64 of wheel 63 and are formed by elongate profiled slats which are arranged distributed between two rotatable rings 71. Slats 65 lie outside suction opening 61. Rotation shaft 64 is mounted in upper plate 67 and blade wheel 63 is driven by a motor 72, for instance an electric motor, which is mounted around the shaft 64 on upper plate 67.

When the blade wheel 63 is set into rotation in the direction of arrow R by motor 72, cooling air is drawn in through opening 61 in base plate 46 and blown out in housing 60 roughly transversely of the direction of shaft 64. The space between blade wheel 63 and the spiral-shaped side wall 66 of the housing increases gradually as seen in the rotation direction, whereby the flow of the cooling air is gradually slowed down and the air leaves fan 14 through outlet opening 62 at relatively low speed. The noise production is hereby limited. Owing to the form and disposition of blade wheel 65 a considerable amount of air can already be displaced at relatively low rotation speeds, whereby the cooling capacity is relatively large. The fan 14 could for instance have a rotation speed of about 3500 rpm, where in the case of axial fans rotation speeds are generally applied in the order of 7000 rpm.

Although the fan 14 shown and described above is in an arrangement in which it draws in air, it can also be used to blow cooling air while still retaining the advantages resulting from its configuration. For this purpose the suction opening 61 is connected to suction opening 12 in casing 1, while outlet opening 62 is fixed to connecting part 34 via a coupling 79 (FIG. 11). This connecting part 34 is in turn fixed in the known manner to a component for cooling and the cooling block 35 arranged thereon. In order to guide the flow in a uniform distribution from outlet opening 62 to connecting part 34, two baffles 80 are also arranged in coupling 79.

The invention thus provides a casing in which electrical and/or electronic components can be optimally cooled with relatively simple means. This makes it possible to accommodate a large number of high-power components, such as are for instance found in a server, in a casing of compact dimensions. Measurements on a prototype have shown that, even at very high processor load, the temperature of a motherboard 2 in the casing 1 according to the invention becomes no higher than about 25 EC, while the temperature of the processor itself varies between 40 and 55 EC. An identical motherboard in a casing with the same dimensions and lay-out, but without the improved cooling according to the invention, reaches a temperature at the same load of about 55 to 60 EC. The temperature of the processor rises here to almost 85 EC.

Although the invention is elucidated above on the basis of a number of embodiments, it will be apparent that it is not limited thereto, but can be varied in many ways without departing from the scope of the claims. In addition, it will be apparent that the different parts of the casing, such as the fan, the connecting part and the cooling block, can also be applied in other combinations while still retaining the advantages associated therewith.

The scope of the invention is therefore defined solely by the following claims.

The invention claimed is:

1. Fan for drawing in cooling air for at least one of electrical and electronic components, comprising:
   a housing with at least one suction opening, at least one outlet opening and at least one wheel arranged between the suction opening and the outlet opening for rotation on an axis and bearing a number of blades;
   a frame; and
   a number of walls enclosing the electrical components, wherein the at least one suction opening and the at least one outlet opening for cooling air is formed in the walls, and wherein the at least the suction opening is provided with filter material, and the fan is connected to at least one of the electrical and electronic components via at least one of a connecting part and a connecting hose, wherein
      the blades in the wheel are placed and embodied such that the flow of the cooling air generated thereby has a radial or centrifugal component, and
      the housing includes a base plate having a means for fixing the fan to at least one of a connecting part and a cooling hose, the at least one of the connecting part and the cooling hose being connectable to the at least one electrical and electronic components.

2. Fan as claimed in claim 1, wherein the blades extend at least partly parallel to the rotation axis of the wheel.

3. Fan as claimed in claim 2, wherein the blades are formed by elongate, profiled slats arranged distributed on a rotatable ring and extending substantially parallel to the rotation axis of the ring.

4. Fan as claimed in claim 3, wherein the suction opening debouches within a periphery defined by the slats.

5. Fan as claimed in claim 1, wherein the housing has an inner wall moving in a spiral shape away from the wheel in the rotation direction of the blade wheel.

6. Fan as claimed in claim 1, wherein the outflow opening is oriented substantially transversely of the rotation axis of the blade wheel.

7. Fan as claimed in claim 1, wherein the wheel has a dimension in an axial direction and a diameter, the axial dimension of the blade wheel being substantially equal to the diameter.

* * * * *